United States Patent
Carey et al.

(10) Patent No.: US 10,848,171 B1
(45) Date of Patent: Nov. 24, 2020

(54) HYBRID MULTIPLYING CAPACITIVE DIGITAL-TO-ANALOG CONVERTER (MC-DAC) BASED LOOP REGULATION

(71) Applicant: Xilinx, Inc., San Jose, CA (US)

(72) Inventors: Declan Carey, Cork (IE); Frantz Stephane Florent Ngankem Ngankem, Cork (IE); Pedro W. Neto, Munster (IE); Ronan Casey, Cork (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/745,252

(22) Filed: Jan. 16, 2020

(51) Int. Cl.
  *H03M 1/66* (2006.01)
  *H03K 19/0175* (2006.01)

(52) U.S. Cl.
  CPC .... *H03M 1/667* (2013.01); *H03K 19/017509* (2013.01); *H03K 19/0175* (2013.01); *H03M 1/66* (2013.01)

(58) Field of Classification Search
  CPC H03M 1/667; H03M 1/66; H03K 19/017509; H03K 19/0175
  USPC .................................................. 341/150, 144
  See application file for complete search history.

(56) References Cited

U.S. PATENT DOCUMENTS

| | | | | |
|---|---|---|---|---|
| 9,654,135 | B2 * | 5/2017 | Miki | H03M 1/0626 |
| 10,601,437 | B1 * | 3/2020 | Kuttner | H04B 1/04 |
| 10,715,163 | B2 * | 7/2020 | Chao | H03M 1/1033 |

OTHER PUBLICATIONS

Te Han, Weixin Gai, A 2.7-GHz Digitally-Controlled Ring Oscillator with Supply Sensitivity of 0.0014%-fDCO/1%-VDD Using Digital Current-Regulated Tuning, IEEE, 2013, 4 pages, China.
John Crossley, Eric Naviasky, Elad Alon, An Energy-Efficient Ring-Oscillator Digital PLL, IEEE, 2010, 4 pages, US.
Amr Elshazly, Rajesh Inti, Wenjing Yin, Brian Young, Pavan Kumar Hanumolu,A 0.4-to-3 GHz Digital PLL With PVT Insensitive Supply Noise Cancellation Using Deterministic Background Calibration, IEEE Journal of Solid-State Circuits, vol. 46, No. 12, Dec. 2011, 13 pages, US.
Sudhir S. Kudva, Sanquan Song, John Poulton, John Wilson, Wenxu Zhao, C. Thomas Gray, A Switching Linear Regulator Based on a Fast-Self-Clocked Comparator with Very Low Probability of Metastability and a Parallel Analog Ripple Control Module, IEEE, 2018, 4 pages. CA, US.

(Continued)

*Primary Examiner* — Brian K Young
(74) *Attorney, Agent, or Firm* — Craige Thompson; Thompson Patent Law

(57) ABSTRACT

Apparatus and associated methods relate to providing a regulation loop using a digital representation of a loop error signal along with a flexible multiplying capacitive digital-to-analog converter (MC-DAC) circuit to control one or more power switches (e.g., transistors) delivering required power (including voltage and/or current) to a load circuit. In an illustrative example, the MC-DAC circuit may include a digital-to-analog converter (DAC) configured to selectively couple to two different reference voltages in response to switch control signals generated by a digital filter. A capacitive level shifter may be coupled to the output of the DAC. A re-sampling circuit may be coupled to the output of the capacitive level shifter to generate a gate control signal to control the one or more power switches. The regulation loop may advantageously generate the gate control signal using a substantially reduced die area.

20 Claims, 14 Drawing Sheets

(56) References Cited

OTHER PUBLICATIONS

Buchanan N.B., Fusco V.F.,Injection locked oscillator lock detector. Electronics Letters, 52(2), 2015, retrieved online from <https://doi.org/10.1049/el.2015.3103> on Oct. 28, 2019, p. 141-143, 3 pages.

* cited by examiner

State 2

HYBRID MULTIPLYING CAPACITIVE DIGITAL-TO-ANALOG CONVERTER (MC-DAC) BASED LOOP REGULATION

TECHNICAL FIELD

Various embodiments relate generally to digital-to-analog converter and loop regulation.

BACKGROUND

Modern networks are responsible for interconnecting computing devices operable to exchange data. Data may be exchanged from circuit to circuit on a common circuit board or from circuit board to circuit board along a common backplane, for example, in a computer or server. In some implementations, data may be exchanged over long distances, for example, from a travel agent's computer to an airline server on a cloud network.

Data can be transferred in the form of digital (e.g., bits and bytes) or analog (e.g., radio frequency (RF)) signals. Data communication systems may physically transfer the data from a transmitter to a receiver via wired and/or wireless links. Further, some data communication systems may need to operate within one or more frequency bands to match a transmit frequency to a receive frequency.

Some transmit or receive circuits that operate over a range of frequencies may use a phase-locked loop (PLL). In general, a PLL may be a frequency control circuit that generates an output signal whose phase is related to the phase of an input signal. A PLL may be formed from a frequency oscillator (e.g., a voltage-controlled oscillator (VCO)) coupled with a phase detector in a feedback loop.

SUMMARY

Apparatus and associated methods relate to providing a regulation loop using a digital representation of a loop error signal along with a flexible multiplying capacitive digital-to-analog converter (MC-DAC) circuit to control one or more power switches (e.g., transistors) delivering required power (including voltage and/or current) to a load circuit. In an illustrative example, the MC-DAC circuit may include a digital-to-analog converter (DAC) configured to selectively couple to two different reference voltages in response to switch control signals generated by a digital filter. A capacitive level shifter may be coupled to the output of the DAC. A re-sampling circuit may be coupled to the output of the capacitive level shifter to generate a gate control signal to control the one or more power switches. The regulation loop may advantageously generate the gate control signal using a substantially reduced die area.

Various embodiments may achieve one or more advantages. For example, some embodiments may omit or reduce the use of analog and/or analog filters, which may advantageously reduce the total area of the regulation loop. Some embodiments provide a quantity transform circuit that may be configured to change the unit of the regulated output voltage (to current, frequency, pulse width, phase, for example). Thus, the regulation loop may be used in various applications that include a feedback loop. Some embodiments provide a hybrid digital/analog loop that delivers power to the load via, for example, a non-segmented device with adjustable strength permitting gate and output decoupling in a manner that allows for good power supply rejection (PSR) performance. Some embodiments may implement a capacitive digital-to-analog converter (CDAC) with flexible range and resolution that permits fine control of the generation of the gate control voltage. The flexible range and resolution may also be used to reduce the range of the DAC in a dynamic manner to reduce signal deviations due to LSB (least significant bit) toggling in a settled condition. The arrangement of the CDAC may permit programmability and/or automation of the range and resolution settings.

In one exemplary aspect, a circuit includes a digital-to-analog converter (DAC) having an input capacitance array and a first capacitor, the first capacitor is coupled between an output node of the DAC and a predetermined voltage node, one or more capacitors in the input capacitance array are selectively coupled to receive a first programmable reference voltage signal and a second programmable reference voltage signal to generate an intermediate voltage signal to charge the first capacitor in response to a number of switch control signals derived from an n-bit digital filter. The circuit also includes a capacitive level shifter having a first terminal and a second terminal, the first terminal is selectively coupled to a third programmable reference voltage, and the second terminal is selectively coupled to a fourth programmable reference voltage, the second terminal is further selectively coupled to the DAC to receive the intermediate voltage signal. The circuit also includes a re-sampling circuit selectively coupled to the first terminal of the capacitive level shifter to generate a settled voltage signal by refreshing the DAC and the capacitive level shifter. In some embodiments, a value of the settled voltage signal may be a function of the first, second, third, and fourth programmable reference voltage signals. In some embodiments, a value of the settled voltage signal may also be a function of DAC code and a capacitance value of the input capacitance array in the DAC.

In some embodiments, the DAC may include a first plurality of switches, a second plurality of switches, and a plurality of sub capacitors. One terminal of each sub capacitor of the plurality of sub capacitors commonly connected to a first node A, the other terminal of each sub capacitor of the plurality of sub capacitors coupled to the first reference voltage through a corresponding switch of the first plurality of switches and coupled to the second reference voltage through a corresponding switch of the second plurality of switches. The DAC may include a first capacitor coupled between the first node A and a low impedance voltage node.

In some embodiments, the capacitive level shifter may include a second capacitor having a second node B and a third node C, the second node B may be coupled to the fourth programmable reference voltage through a fourth switch, and the third node C may be coupled to the third programmable reference voltage through a third switch, the second node B may be further coupled to the first node A through a fifth switch.

In some embodiments, the re-sampling circuit may include a third capacitor with one end coupled to the third node C through a sixth switch, and the other end of the third capacitor may be coupled to a low impedance voltage node. In some embodiments, the DAC may include a capacitive DAC. In some embodiments, the circuit may also include a reference voltage generation circuit configured to generate the first, the second, the third, and the fourth programmable reference voltage signals for the DAC and the capacitive level shifter.

In another exemplary aspect, a system includes a comparator configured to receive a signal and a first predetermined reference value to generate a comparison result. The system also includes a digital filter coupled to an output of the comparator to receive the comparison result. The system also includes an analog voltage generation circuit coupled to an output of the digital filter to generate a first analog signal. The analog voltage generation circuit includes (a) a digital-to-analog converter (DAC) having an input capacitance array and a first capacitor, the first capacitor is coupled between an output node of the DAC and a predetermined voltage node, one or more capacitors in the input capacitance array are selectively coupled to receive a first programmable reference voltage signal and a second programmable reference voltage signal to generate an intermediate voltage signal to charge the first capacitor in response to a number of switch control signals derived from the digital filter, (b) a capacitive level shifter having a first terminal and a second terminal, the first terminal is selectively coupled to a third programmable reference voltage, and the second terminal is selectively coupled to a fourth programmable reference voltage, the second terminal is further selectively coupled to the DAC to receive the intermediate voltage signal, and, (c) a re-sampling circuit selectively coupled to the first terminal of the capacitive level shifter to generate a settled voltage signal by refreshing the DAC and the capacitive level shifter.

In some embodiments, the settled voltage signal may be a function of the first, the second, the third, and the fourth programmable reference voltage signals. In some embodiments, the settled voltage signal may also be a function of DAC code and a capacitance value input capacitance array in the DAC. In some embodiments, the system may also include a voltage drive circuit coupled to the analog voltage generation circuit to receive the first analog signal.

In some embodiments, the DAC may include a first plurality of switches and a second plurality of switches. The DAC may include a plurality of sub capacitors, one terminal of each sub capacitor of the plurality of sub capacitors commonly connected to a first node A, the other terminal of each sub capacitor of the plurality of sub capacitors coupled to the first programmable reference voltage signal through a corresponding switch of the first plurality of switches and coupled to the second programmable reference voltage signal through a corresponding switch of the second plurality of switches. The DAC may include a first capacitor coupled between the first node A and a low impedance voltage node.

In some embodiments, the capacitive level shifter may include a second capacitor having a second node B and a third node C, the second node B may be coupled to the fourth programmable reference voltage signal through a fourth switch, and the third node C may be coupled to the third programmable reference voltage signal through a third switch, the second node B may be further coupled to the first node A through a fifth switch. In some embodiments, the re-sampling circuit may include a third capacitor with one end coupled to the third node C through a sixth switch, and the other end of the third capacitor may be coupled to a low impedance voltage node.

In another exemplary aspect, a method includes providing a digital-to-analog converter (DAC) having an input capacitance array and a first capacitor, coupling the first capacitor between an output node of the DAC and a low impedance voltage node, coupling the input capacitance array to selectively receive a first programmable reference voltage signal and a second programmable reference voltage signal via a number of switches and generate an intermediate voltage signal at the output node A, providing a capacitive level shifter having a first terminal and a second terminal, controllably coupling the first terminal to a third programmable reference voltage signal and coupling the second terminal to a fourth programmable reference voltage signal, controllably coupling the second terminal to the output node of the DAC to receive the intermediate voltage signal at the output node of the DAC, and, providing a re-sampling circuit and coupling one terminal of the re-sampling circuit to the first terminal of the capacitive level shifter to generate a gate control signal.

In some embodiments, a value of the gate control signal may be a function of the first, the second, the third, and the fourth predetermined reference voltage signals. In some embodiments, a value of the gate control signal may also be a function of a capacitance value of the input capacitance array in the DAC. In some embodiments, providing the capacitive level shifter may include providing a second capacitor having a second node B and a third node C, coupling the second node B to the fourth programmable reference voltage signal through a fourth switch and coupling the second node B to the first node A through a fifth switch, and, coupling the third node C to the third programmable reference voltage signal through a third switch. In some embodiments, the re-sampling circuit may include a sixth switch coupled between the third node C and a fourth node D. The re-sampling circuit may also include a third capacitor coupled between the fourth node D and a predetermined low impedance voltage node. The gate control signal may include a voltage signal at the fourth node D.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to providing a regulation loop using a digital representation of a loop error signal along with a flexible multiplying capacitive digital-to-analog converter (MC-DAC) circuit to control one or more power switches (e.g., transistors) delivering required power (including voltage and/or current) to a load circuit. In an illustrative example, the MC-DAC circuit may include a digital-to-analog converter (DAC) configured to selectively couple to two different reference voltages in response to switch control signals generated by a digital filter. A capacitive level shifter may be coupled to the output of the DAC. A re-sampling circuit may be coupled to the output of the capacitive level shifter to generate a gate control signal to control the one or more power switches. The regulation loop may advantageously generate the gate control signal using a substantially reduced die area.

To aid understanding, this document is organized as follows. First, an exemplary platform (e.g., an FPGA) suitable to perform data communication is briefly introduced with reference to FIG. 1. Second, with reference to FIGS. 2-6, the discussion turns to the architecture of a multiplying capacitor digital-to-analog converter (MC-DAC) implemented in a regulation loop and methods used to configure and operate MC-DAC. Third, with reference to FIGS. 7A-8, exemplary sample situations for the MC-DAC settings and simulations of an output voltage of the MC-DAC are discussed. Then, with reference to FIGS. 9-10, exemplary circuits that may be further implemented in the regulation loop are discussed. Finally, with reference to FIG. 11, another exemplary platform (e.g., a system-on-Chip (SOC)) suitable to perform data communication and load voltage regulation is briefly introduced.

Figure 1:
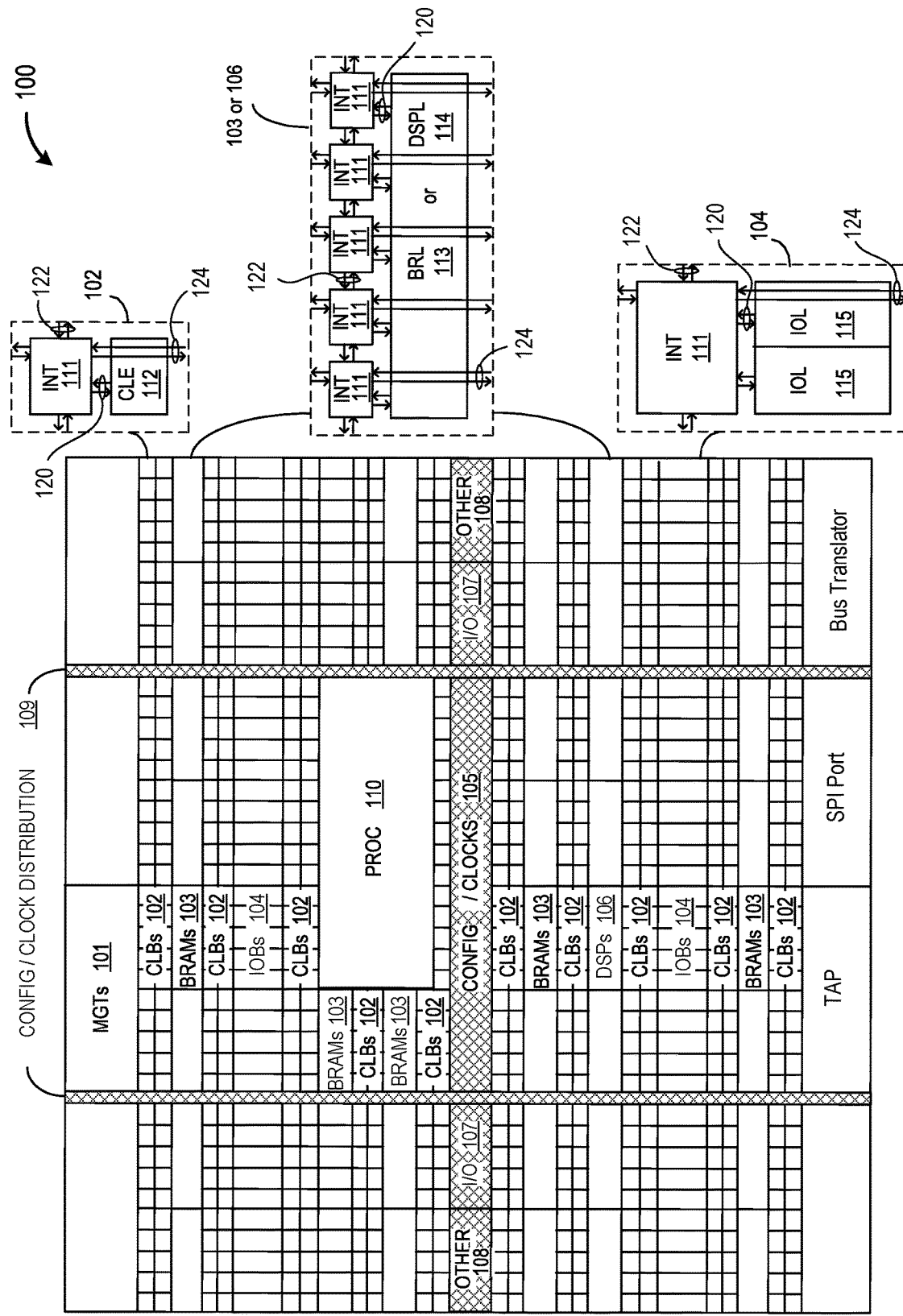
FIG. 1 depicts an exemplary programmable integrated circuit (IC) on which the disclosed circuits and processes may be implemented. [0017-0024]

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic. In some embodiments, the programmable IC 100 may also include ADCs and/or DAC tiles.

MGTs may utilize regulated feedback control loops, for example, in the generation of analog reference voltages and currents, regulated supplies for CMOS circuits, or clock signals used various circuits (e.g., analog, digital and mixed signal circuits). In some embodiments, a controllable transistor (e.g., N type or P type MOSFET of possibly variable strength) may connect a variable/external/chip level supply to one or more blocks requiring a regulated supply (whether to provide the supply itself as the purpose of the loop, or to provide the supply as a means of controlling a different quantity). An alternative means may be used to generate a gate voltage for the controllable transistor while advantageously reducing the area of the loop.

Figure 2:
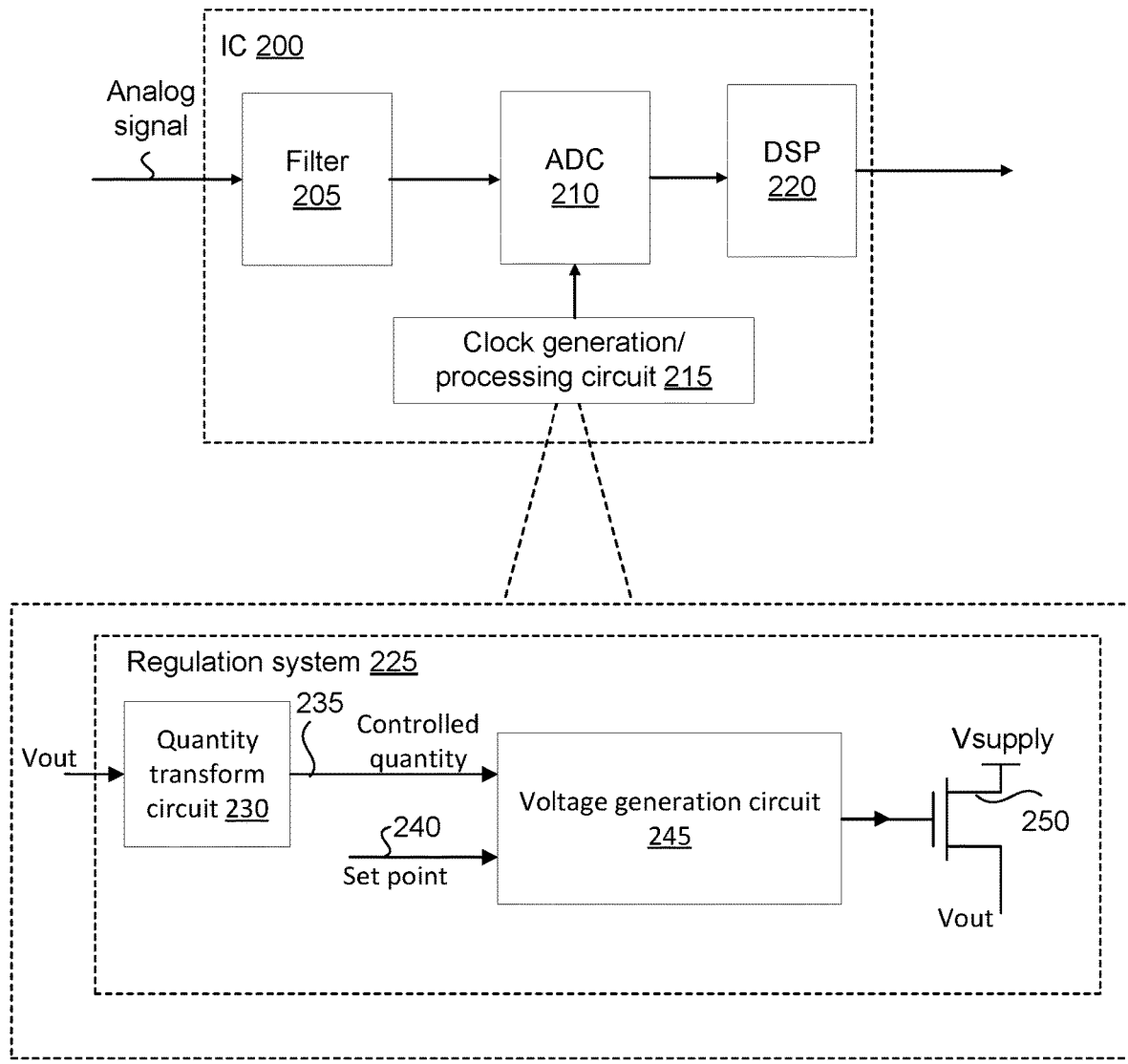
FIG. 2 depicts a block diagram of an exemplary regulation system implemented in a phase-locked-loop.

FIG. 2 depicts a block diagram of an exemplary regulation system implemented in a clock generation/processing circuit. In this depict example, an integrated circuit (IC 200), for example, implemented in a base station or a mobile phone, is used to process data communications. The IC 200 includes a filter 205 configured to filter an incoming analog signal. The IC 200 also includes one or more analog-to-digital converters (ADCs) 210 that sample and convert the filtered analog signal into a digital signal. The sampling and conversion may be controlled by different clock signals. The clock signals may be generated by a clock generation/processing circuit 215 and then processed by a digital signal processor (DSP) 220, for example. The clock generation/processing circuit 215 may be a digital phase-locked loop (DPLL). In some embodiments, the IC 240 may also include one or more digital-to-analog converters (DACs) to sample and convert digital signals into analog signals. The sampling and converting of the DACs may also be controlled by clock signals generated by the clock generation/processing circuit 215. The clock generation/processing circuit 215 may also be used to provide clock signals to other functional blocks (e.g., flip flops). A regulation system 225 with a substantially reduced area may be implemented, for example, in the clock generation/processing circuit, to generate a regulated voltage for, for example, an injected-locked oscillator.

In this depicted example, a regulated voltage signal $V_{out}$ is generated by a regulation system 225. The regulation system 225 includes a quantity transform circuit 230 configured to transform the quantity and/or the unit of the regulated voltage signal $V_{out}$ to generate a controlled quantity signal 235. For example, in some embodiments, the quantity transform circuit 230 may be a wire (e.g., a trace or a net) that directly transfers the regulated voltage signal $V_{out}$ to be processed by a voltage generation circuit 245. In some embodiments, the quantity transform circuit 230 may be a linear division circuit to generate the controlled quantity signal 235 (e.g., $V_{out}/2$). In some embodiments, the quantity transform circuit 230 may be used to change the unit of the regulated voltage signal $V_{out}$ from voltage to, for example, current, pulse width, time, phase, or frequency. For example, the quantity transform circuit 230 may include a voltage-controlled oscillator or an injection locked oscillator.

The controlled quantity signal 235 is then received by a voltage generation circuit 245. The voltage generation circuit 245 processes the controlled quantity signal 235 to generate a gate control signal $V_{gate}$ to be applied to a power switch (e.g., MOSFET) 250. The power switch 250 generates the regulated voltage signal $V_{out}$ that may be applied to a load circuit (e.g., VCO, ILO). In this depicted example, the voltage generation circuit 245 also receives a predetermined set point 240. The predetermined set point 240 may be a reference signal that has the same unit with the controlled quantity signal 235. In some embodiments, the predetermined set point (e.g., zero) may be implicit. In some embodiments, the set point may be dynamic. The regulation system 225 may be applied to regulate any generic output load or output target quantity. An exemplary architecture of the voltage generation circuit 245 with a substantially reduced area is discussed in detail with reference to FIG. 3.

Figure 3:
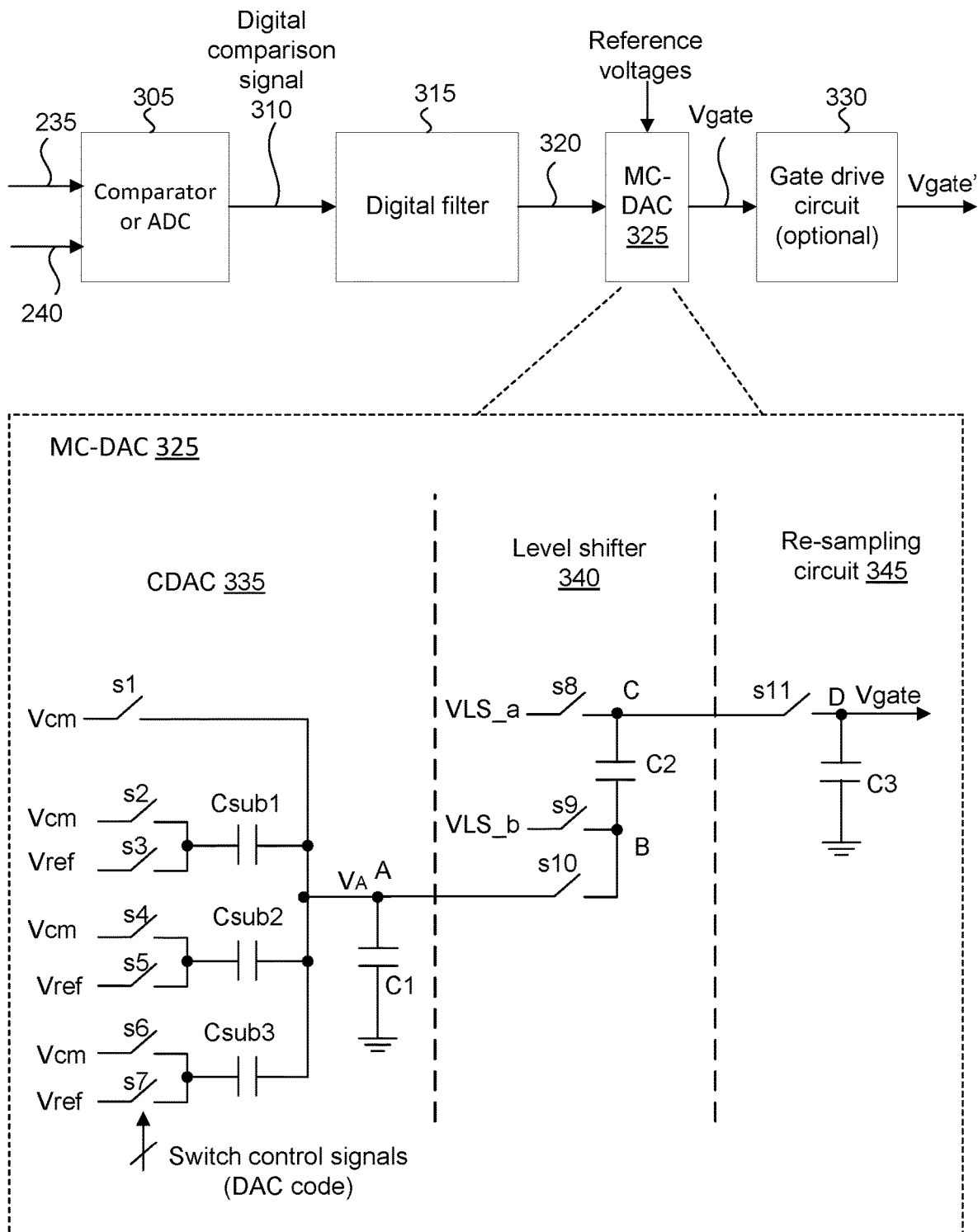
FIG. 3 depicts a block diagram of an exemplary multiplying capacitive digital-to-analog converter (MC-DAC) implemented in an exemplary voltage generation circuit of the regulation system.

FIG. 3 depicts a block diagram of an exemplary multiplying capacitive digital-to-analog converter (MC-DAC) implemented in an exemplary voltage generation circuit of the regulation system. In this depicted example, the voltage generation circuit 245 includes a digital comparator 305 configured to receive the controlled quantity signal 235 and the predetermined set point 240 to generate a digital comparison signal 310. In some embodiments, the comparison may be extended beyond voltage or current comparison to include, for example, time comparisons, such as with time-to-digital converters. The digital comparison signal (e.g., an n-bit signal) 310 is then received by a digital filter 315. In some embodiments, the digital error detection (e.g., the comparison performed by the comparator 305) may be chopped or have its decisions repeated (e.g., majority voting schemes) to suppress noise. In some embodiments, the digital filter 315 may include a digital integrator. In some embodiments, the digital filter 315 may also include circuits having non-linearities, memory, calibration circuits, and/or state machines, for example. The digital filter 315 receives the digital comparison signal (e.g., an n-bit signal) 310 to generate a filtered comparison signal 320. The filtered comparison signal 320 is then received by a multiplying capacitive digital-to-analog converter (MC-DAC) 325. The MC-DAC 325 then generates the gate control signal $V_{gate}$ in response to the filtered comparison signal 320 (e.g., corresponding DAC codes used to control switches in the MC-DAC 325) and selected reference voltages to be processed by the MC-DAC 325. In some embodiments, the voltage generation circuit 245 may also include a gate drive circuit 330 that is configured to, for example, amplify the gate control signal $V_{gate}$.

In some embodiments, the digital comparator 305 may be replaced by an analog-to-digital converter (ADC). The comparator or the ADC may have finite resolutions, resulting in an integrator output toggling between code states. In contrast to analog related solutions that have a settled state dictated by noise, the digital solution may have a finite limit cycle.

The MC-DAC 325, in this depicted example, includes a digital-to-analog converter (DAC) 335 (e.g., a capacitive DAC) configured to receive predetermined reference voltages $V_{cm}$ and $V_{ref}$ in response to the filtered comparison signal 320. The implementation of a capacitive digital-to-analog converter (CDAC) with flexible range and resolution permits fine control of the generation of the gate control voltage. The arrangement of the CDAC may also permit automation of the range and resolution settings. The predetermined reference voltages $V_{cm}$ and $V_{ref}$ may be generated or provided by various circuits. An exemplary circuit used to generate the predetermined reference voltages $V_{cm}$ and $V_{ref}$ is described in detail with reference to FIG. 10. In this depicted example, the DAC 335 is a 3-bit capacitive DAC, and includes seven switches $S_1$-$S_7$, three sub capacitors $C_{sub1}$, $C_{sub2}$, and $C_{sub3}$, and a first capacitor $C_1$. Each of the three sub capacitors $C_{sub1}$, $C_{sub2}$, and $C_{sub3}$ has two terminals, with one terminal commonly connected to a first node A, and the other terminal connected to a first reference voltage $V_{ref}$ through a first switch and a second reference voltage $V_{cm}$ through a second switch, respectively. For example, the capacitor $C_{sub1}$ has one terminal connected to the node A, and the other terminal is connected to both the first reference voltage $V_{ref}$ through switch $S_2$ and the second reference voltage $V_{cm}$ through $S_3$.

The switches $S_1$-$S_7$ are controlled by a corresponding switch control signal generated by the n-bit digital filter 315. For example, the control of switches may be carried out by a state machine implemented in the digital filter 315. The states of the switches are discussed with reference to FIGS. 5A-5D. The exemplary timing diagrams of switch control signals are shown with reference to FIG. 5E. The first capacitor $C_1$ also has two ends, with one end connected to the first node A, and the other end connected to a low impedance level or reference potential node (e.g., ground). The voltage at the first node A may be defined as $V_{cdacx}$. By opening or closing one or more switches of the seven switches $S_1$-$S_7$, the first reference voltage $V_{ref}$ and the second reference voltage $V_{cm}$ may be selectively processed and received, and the voltage $V_{cdacx}$ at the first node A may be changed accordingly. Exemplary operation modes of the MC-DAC 325 and the CDAC 335 are discussed in further detail with reference to FIGS. 5A-5D.

The DAC 335 may be an n-bit DAC, where n may be any positive integer. In some embodiments, the DAC 335 may be a segmented DAC or thermometric DAC, for example. The MC-DAC 325, in this depicted example, also includes a capacitive level shifter 340. The level shifter 340 is coupled to the first node A through a switch $S_{10}$. In this depicted example, the capacitive level shifter 340 includes a second capacitor $C_2$ having a second node B and a third node C. The bottom plate of the second capacitor $C_2$ is connected to the switch $S_{10}$ through the second node B. The second node B is also coupled to a third reference voltage level $V_{LS\_b}$ through a switch $S_9$. The third node C is coupled to a fourth reference voltage level $V_{LS\_a}$ through a switch $S_8$. The voltage at the third node C may be defined as c. The voltage across the second capacitor $C_2$ may be defined as $V_{c2} = V_{LS\_a} - V_{LS\_b}$. By selecting different voltages (e.g., $V_{LS\_a}$ and $V_{LS\_b}$) applied to the second capacitor $C_2$, the second capacitor $C_2$ may be pre-charged to different voltages.

The MC-DAC 325, in this depicted example, also includes a re-sampling circuit 345. In this depicted example, the re-sampling circuit 345 includes a third capacitor $C_3$. One end of the third capacitor $C_3$ is coupled to a low impedance voltage node (e.g., ground), and the other end (e.g., a fourth node D) of the third capacitor $C_3$ is coupled to the third node C through a switch $S_{11}$. The voltage $V_{C3}$ across the third capacitor $C_3$ (e.g., the voltage at the fourth node D) is finally used as the gate control signal $V_{gate}$. In some embodiments, a gate drive circuit (e.g., the gate drive circuit 330) may be coupled to the node D to further process the voltage generated at the fourth node D to drive the gate of the power switch 250. By implementing the MC-DAC 325 (and the voltage generation circuit 245), an analog error amplifier, a low-pass filter, and/or a regulation amplifier in a regulation loop may be eliminated to generate the gate control signal $V_{gate}$. As the DAC, the capacitive level shifter and the re-sampling circuit may be made with small areas, the total area of the regulation loop may be advantageously reduced accordingly. In addition, the hybrid digital/analog loop that delivers power to the load via a non-segmented device permits the gate terminal and the regulated output decoupling in a manner that allows for good power supply rejection (PSR) performance.

Figure 4:
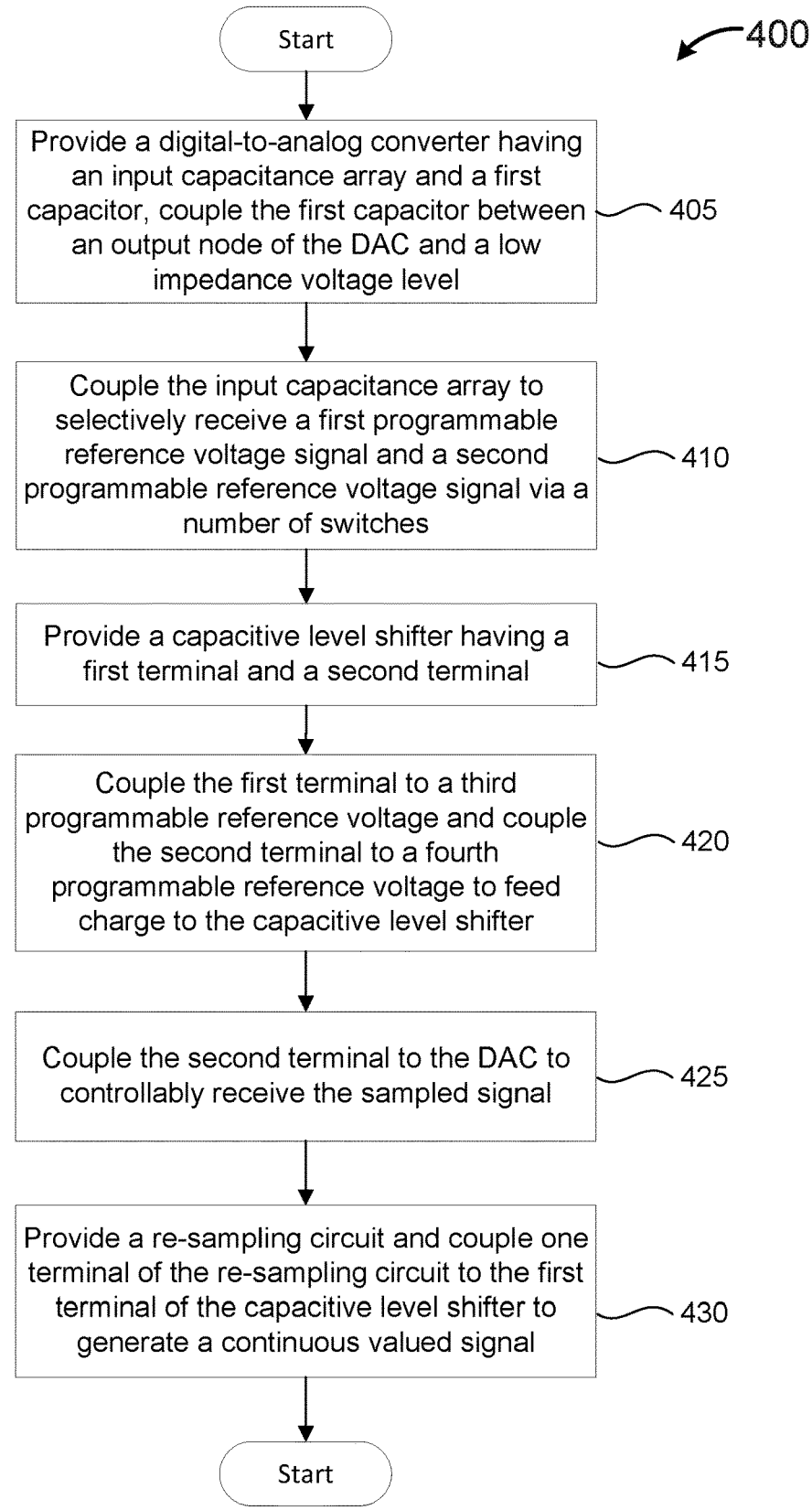
FIG. 4 depicts a flow chart of an exemplary method to implement the multiplying capacitive digital-to-analog converter (MC-DAC).

FIG. 4 depicts a flow chart of an exemplary method to implement the multiplying capacitive digital-to-analog converter (MC-DAC). A method 400 to implement the MC-DAC 325 includes, at 405, providing a digital-to-analog converter (e.g., the DAC 335) having an input capacitance array (e.g., the capacitances $C_{sub1}$-$C_{sub3}$ in the 3-bit CDAC 335) and a first capacitor (e.g., $C_1$), and coupling the first capacitor $C_1$ between an output node (e.g., node A) of the DAC and a low impedance voltage node (e.g., GND). The method 400 also includes, at 410, coupling the input capacitance array to selectively receive a first programmable reference voltage signal (e.g., $V_{cm}$) and a second programmable reference voltage signal (e.g., $V_{ref}$) via a number of switches (e.g., S1-S7) and generate an updated voltage signal (e.g., $V_A$) at the output node A.

The method 400 also includes, at 415, providing a capacitive level shifter (e.g., the capacitive level shifter 340) having a first terminal and a second terminal. The method 400 also includes, at 420, coupling the first terminal to a third programmable reference voltage signal (e.g., $V_{LS\_a}$) through a switch (e.g., switch $S_8$) and coupling the second terminal to a fourth programmable reference voltage signal (e.g., $V_{LS\_b}$) through a switch (e.g., switch $S_9$). The method 400 also includes, at 425, coupling the second terminal to the output node of the DAC to receive the updated voltage signal at the output node of the DAC. The method 400 also includes, at 430, providing a re-sampling circuit (e.g., the re-sampling circuit 345) and coupling one terminal (e.g., node D) of the re-sampling circuit 345 to the first terminal (e.g., node C) of the capacitive level shifter 340 through a switch (e.g., switch $S_{11}$) to generate a gate control signal (e.g., $V_{gate}$). By implementing the MC-DAC to generate the gate control signal $V_{gate}$, the use of an analog error amplifier, a low-pass filter, and/or a regulation amplifier may be eliminated from a regulation loop. As the DAC, the capacitive level shifter and the re-sampling circuit in the MC-DAC may be made with small areas, the total area of the regulation loop may be advantageously reduced accordingly.

Figure 5A:
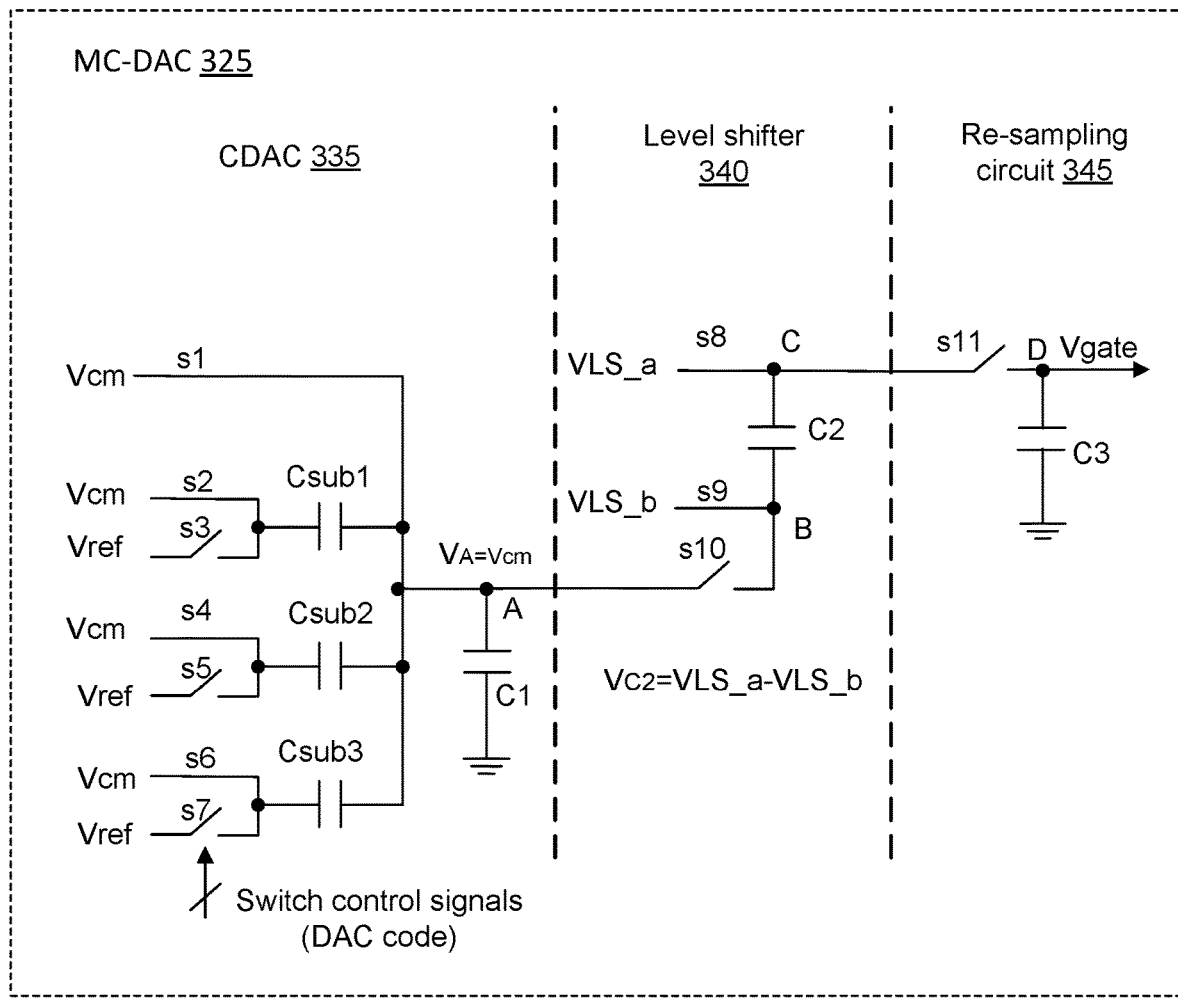
FIGS. 5A-5D depict exemplary operational states of the MC-DAC.

FIGS. 5A-5D depict exemplary operational states of the MC-DAC. FIG. 5A depicts a first operation state of the MC-DAC 335. In the first state, the CDAC 335 is reset and the second capacitor $C_2$ in the capacitive level shifter 340 is pre-charged. More specifically, switches $S_1$, $S_2$, $S_4$ and $S_6$ are closed and the first reference voltage $V_{cm}$ is selected be received and the voltage $V_{cdacx}$ at the node A is reset to $V_{cm}$. Switches $S_8$ and $S_9$ are closed and the second capacitor $C_2$ is pre-charged with level shift voltage setting ($V_{C2} = V_{LS} = V_{LS\_a} - V_{LS\_b}$). The implementation of the CDAC with flexible range and resolution permits fine control of the generation of the gate control voltage.

Figure 5B:
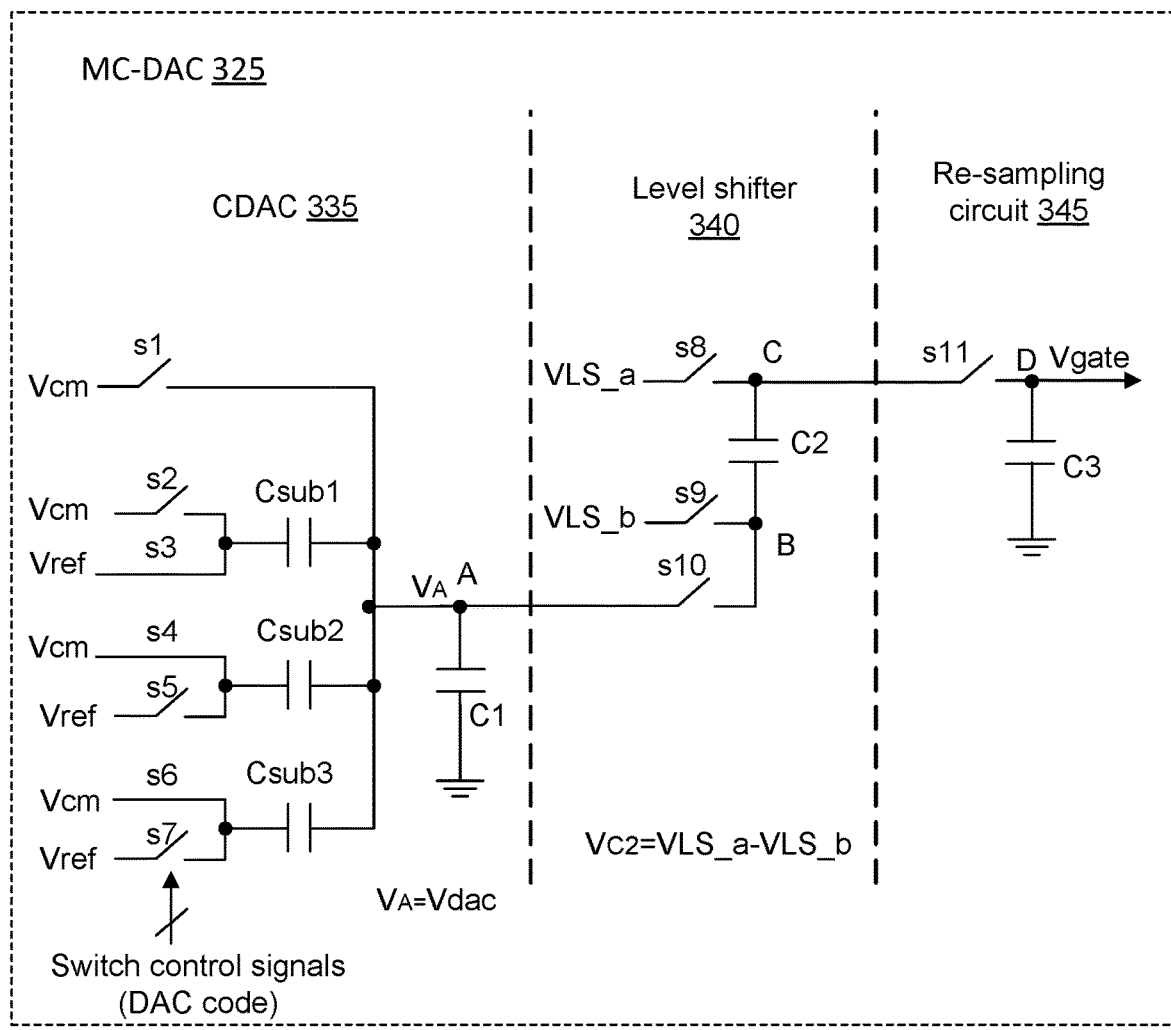
Figure 5B:
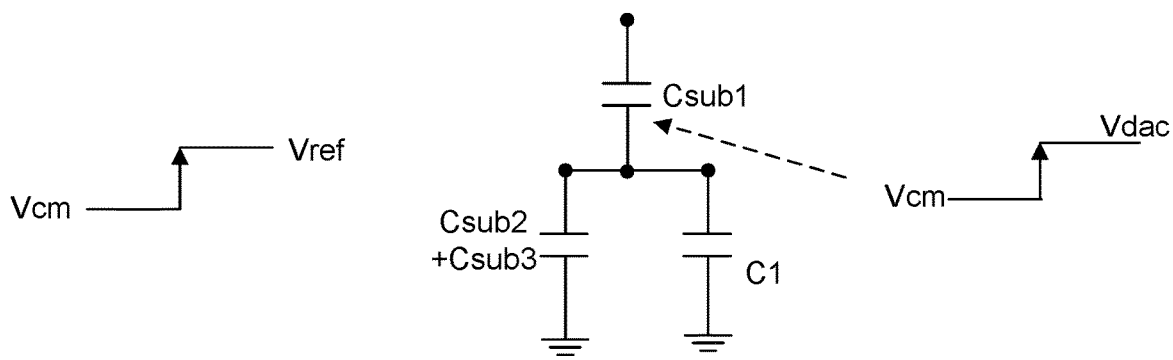

FIG. 5B depicts a second operation state of the MC-DAC 335. In the second state, a DAC voltage at the first node A is set. More specifically, in this depicted example, switches $S_1$ is opened (for the exemplary 3-bit DAC), states switches $S_3$, $S_4$ and $S_6$ are dependent on the DAC control code. In this depicted example, switches $S_3$, $S_4$ and $S_6$ are closed (such a combination is dependent on the DAC control code), $V_{ref}$ is applied to a variable selected set of sub capacitors in the CDAC 335. The voltage $V_{cdacx}$ at the node A is then changed from $V_{cm}$ to $V_{dac}$. The value of the $V_{dac}$ may be dependent on the DAC code, the voltage difference between the first and the second reference voltages, and the relationships among the sub capacitors. For example, when $C_{sub1} = 2 * C_{sub2} = 4 * C_{sub3}$, $V_{dac}$ may be expressed as $V_{dac} = V_{cm} + (V_{ref} - V_{cm}) * (C_{sum1})/(1.75 * C_{sub1} + C_1)$. In the second state, the switches S8 and S9 are also opened, thus, the voltage $V_{c2}$ across the second capacitor C2 is now a floating capacitor and at the capacitive level shifter voltage value (e.g., $V_{LS}$).

Figure 5C:
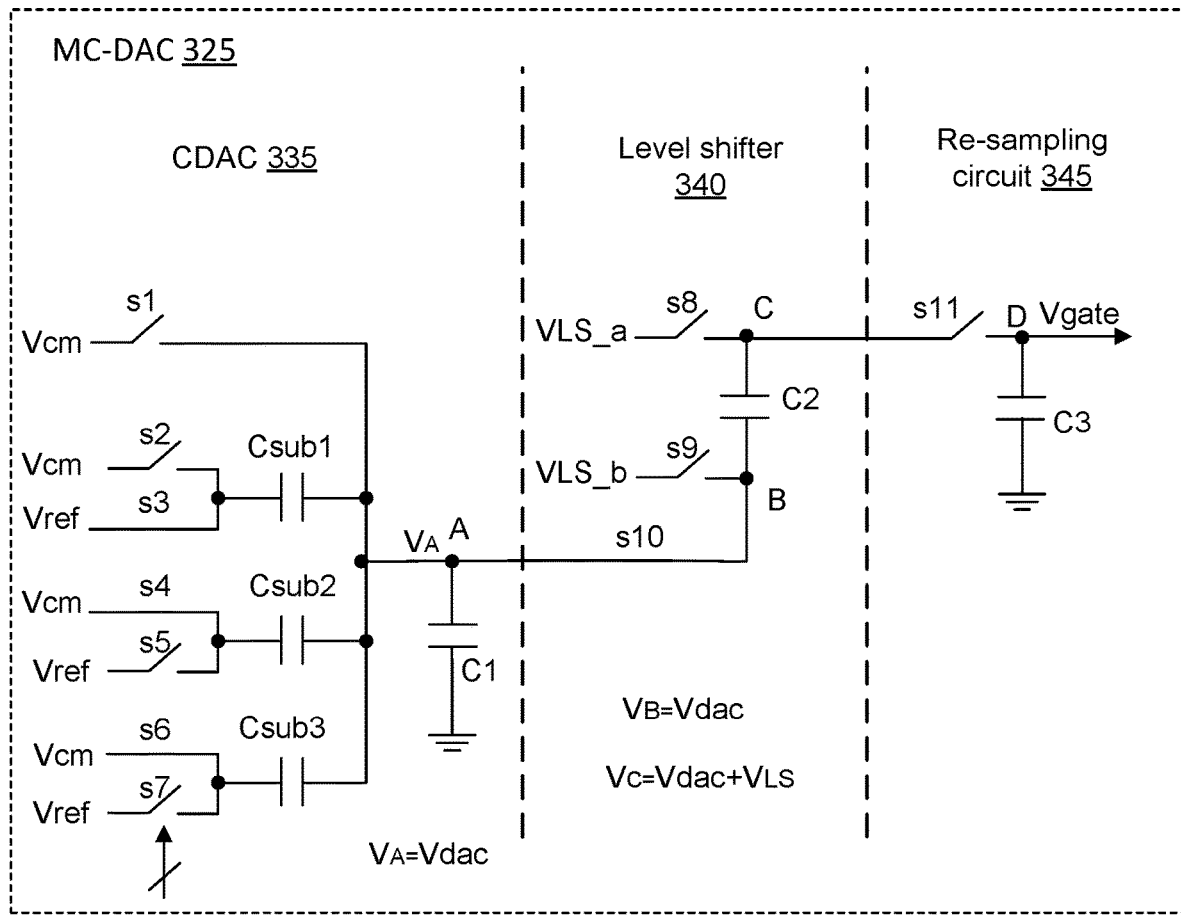

FIG. 5C depicts a third operation state of the MC-DAC 335. In the third state, the DAC voltage $V_{dac}$ is stacked with the capacitive level shifter 340. More specifically, the switch S10 is closed, the bottom plate of the second capacitor $C_2$ is lifted to $V_{dac}$. The top plate of the second capacitor $C_2$ is then lifted to $V_{dac} + V_{LS}$. $V_{LS}$ is the pre-selected level shift value defined by the $V_{LS\_a}$ and $V_{LS\_b}$.

Figure 5D:
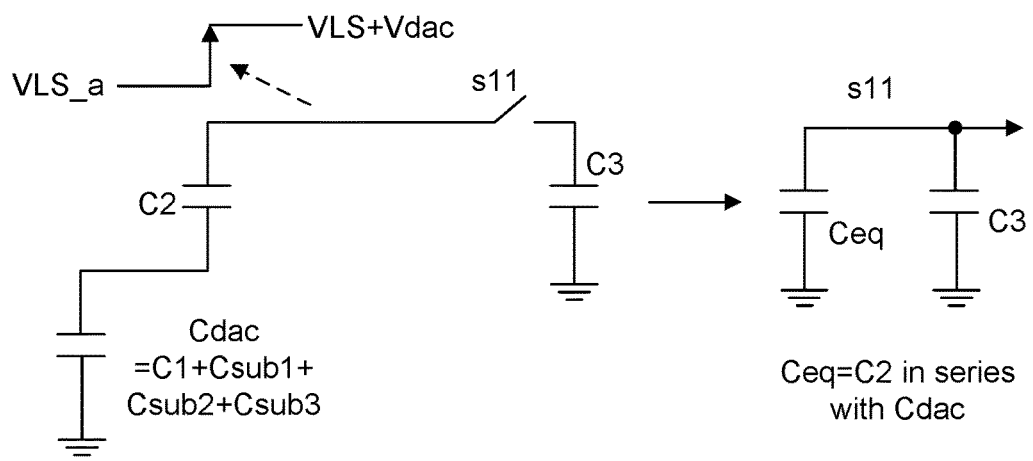

FIG. 5D depicts a fourth operation state of the MC-DAC 335. In the fourth state, the voltage $V_3$ at the node D is changed. The switch S11 is closed, and the third capacitor $C_3$ is shorted to the series combination of the second capacitor $C_2$ and the CDAC 335. The charge sharing then occurs. The four states are then repeated for a single given DAC code. The CDAC 335 and the capacitive level shifter 340 will be refreshed, the re-sampling circuit 345 is not subsequently reset, and the voltage $V_{c3}$ may then approach a state. On one iteration, the voltage $V_{c3}$ may get closer to the value given by $V_{dac} + V_{LS}$. For example, before charge sharing, $V_{c3} = 0$. In a first iteration, the voltage across the third capacitor $C_3$ may be expressed as $V_{c3} = C_{eq} * V_{cls}/(C_{eq} + C_3)$. $C_{eq}$ is the series capacitance of the $C_2$ and $C_{dac}$. $V_{cls}$ is the voltage at the node C. In a second iteration, the voltage across the third capacitor $C_3$ may be expressed as $V_{c3}=(C_{eq}*V_{cls}+C_3*(C_{eq}*V_{cls}/(C_{eq}+C_3)))/(C_{eq}+C_3)$. $C_{eq}$ is the series capacitance of the $C_2$ and $C_{dac}$. $V_{cls}$ is the voltage at the node C. Exemplary simulation results of the voltage $V_{c3}$ (the gate control signal $V_{gate}$) are shown with reference to FIG. 8.

Figure 5E:
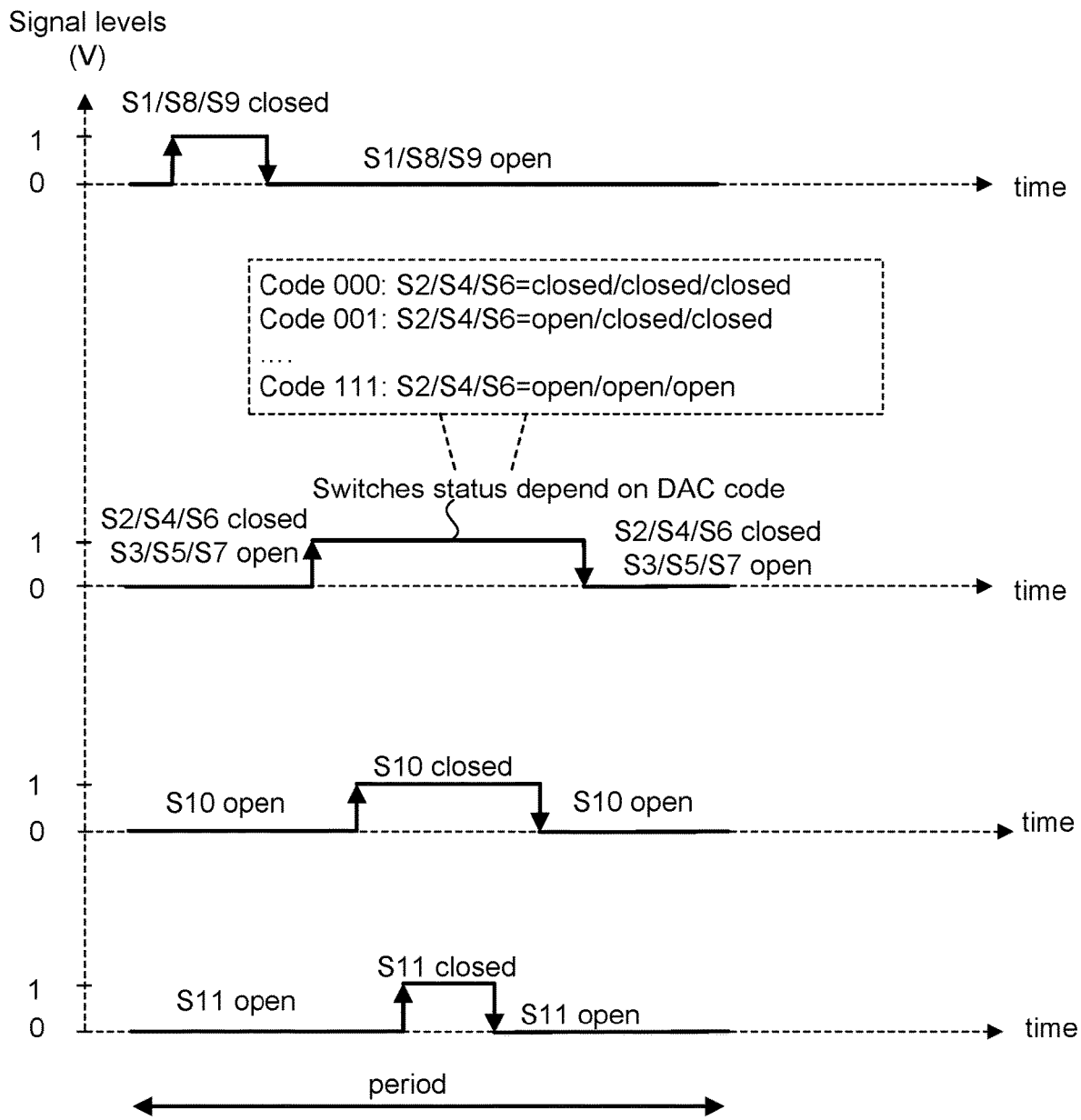
FIG. 5E depicts exemplary clocks during a single application of a DAC code.

FIG. 5E depicts exemplary clocks during a single application of a DAC code. As discussed with reference to FIGS. 5A-5D, when the MC-DAC 325 works in different states/modes, switches (e.g., switches S1-S11) in the MC-DAC 325 may be opened or closed such that $V_{gate}$ may be generated. Exemplary timing diagrams of the switch control signals applied to the switches in the MC-DAC 325 are shown. The period (e.g., 100 ns) indicated along the horizontal axis (e.g., time axis) corresponds to a single iteration for a given DAC code. Repeated iterations may be performed to complete the settling for a single given DAC code.

Figure 6:
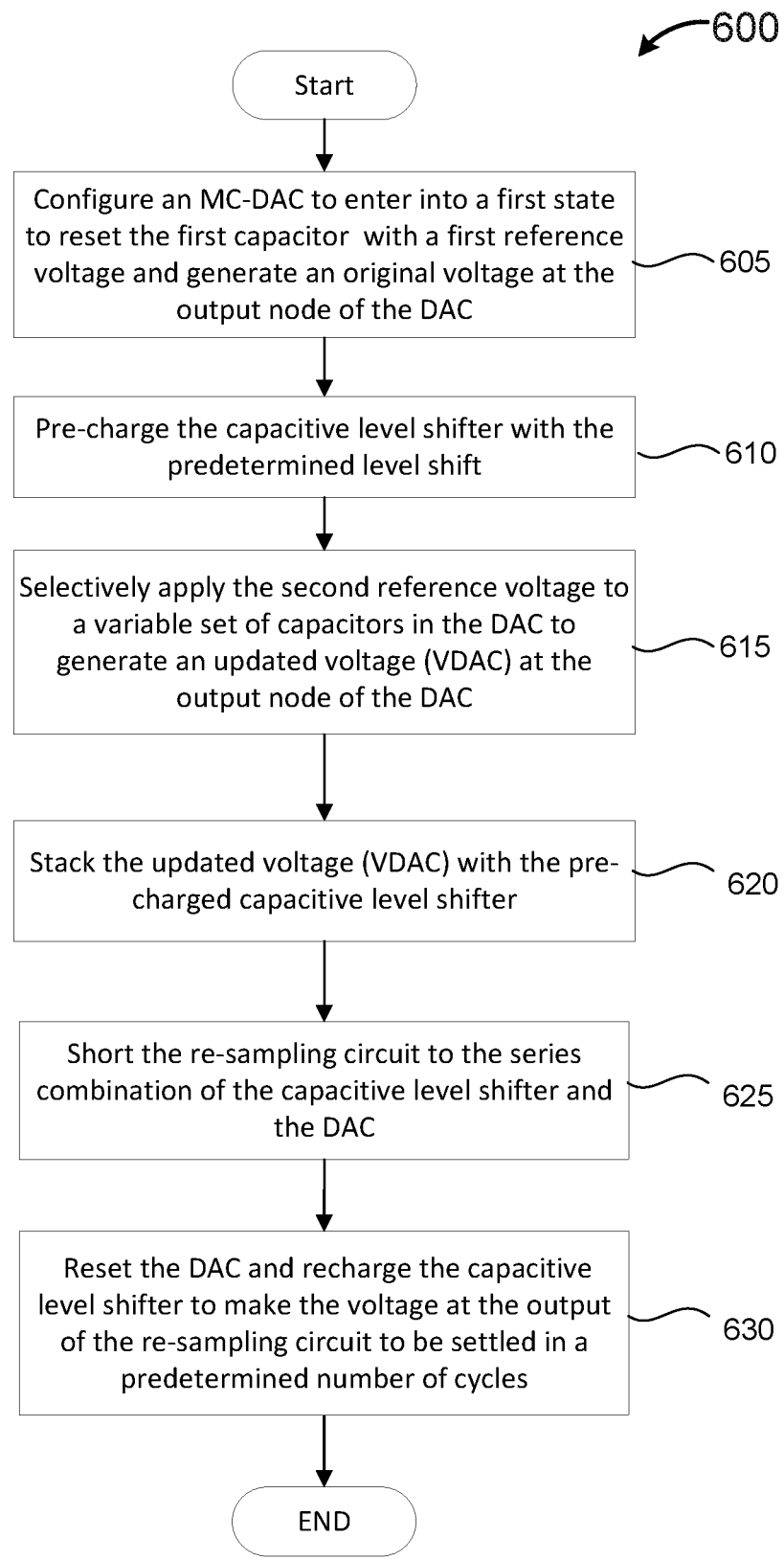
FIG. 6 depicts a flow chart of an exemplary method to operate the MC-DAC.

FIG. 6 depicts a flow chart of an exemplary method to operate the MC-DAC. A method 600 to operate the MC-DAC 325 includes, at 605, configuring an MC-DAC (e.g., the MC-DAC 325) to enter into a first state to reset an analog-to-digital converter (e.g., the CDAC 335) in the MC-DAC 325 with a first programmable reference voltage signal (e.g., $V_{cm}$) and generate an original voltage (e.g., $V_A=V_{cm}$) at the output node of the DAC. The method 600 also includes, at 610, pre-charging a capacitive level shifter (e.g., the capacitive level shifter 340) with a predetermined programmable level shift (e.g., $V_{LS}$). The method 600 also includes, at 615, selectively applying the second programmable reference voltage signal to a variable set of capacitors in the DAC to generate an updated voltage (e.g., $V_A=V_{dac}$) at the output node of the DAC. The method 600 also includes, at 620, stacking the updated voltage $V_{dac}$ with the capacitive level shifter 340. The method 600 also includes, at 625, shorting the re-sampling circuit (e.g., placing the switch S11 in FIG. 5C into a low-impedance mode) to the series combination of the capacitive level shifter 340 and the DAC 335. The method 600 also includes, at 630, resetting the DAC and recharging the capacitive level shifter to make the voltage at the output of the re-sampling circuit to be settled in a predetermined number of cycles to provide a settled gate control signal $V_{gate}$. Thus, the gate control signal $V_{gate}$ may be generated without using analog error amplifiers and/or analog filters, which may advantageously reduce the total area of a regulation loop. In some embodiments, whether the gate control signal $V_{gate}$ is settled or not may be determined by other ways. For example, a voltage sensing circuit may be used to sense the voltage at the output of the re-sampling circuit and then determine whether the voltage at the output of the re-sampling circuit is settled or not (e.g., compare the sensed voltage in a current cycle with the sensed voltage in a previous cycle, or compare the sensed voltage with $V_{dac}$).

Figure 7A:
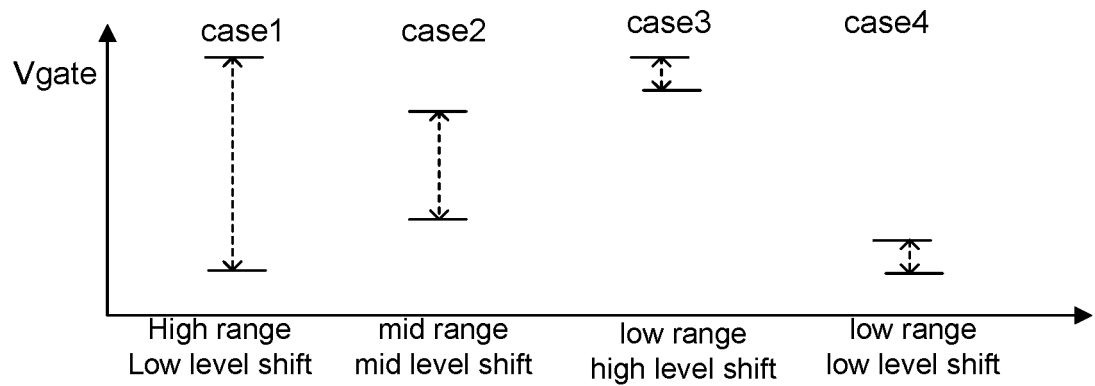
FIGS. 7A-7B depict exemplary MCDAC output voltage ranges.
Figure 7B:
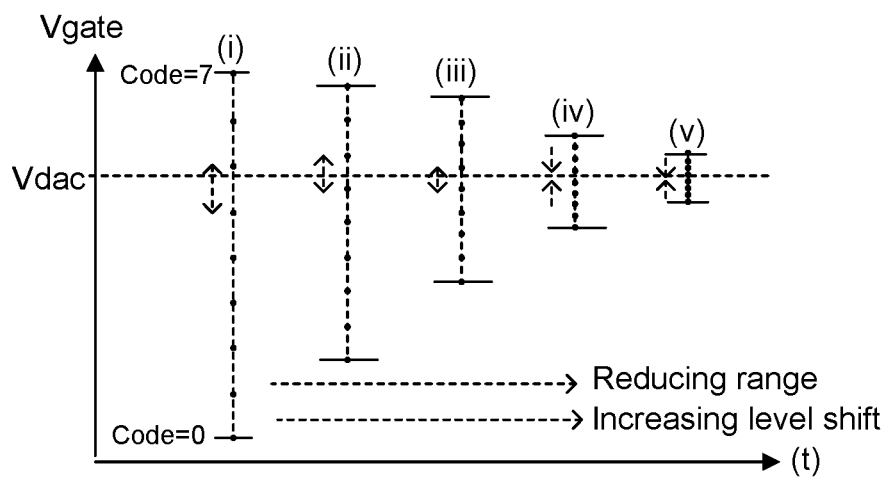

FIGS. 7A-7B depict exemplary MCDAC output voltage ranges. As shown in FIGS. 7A-7B, the difference between $V_{cm}$ and $V_{ref}$ dominates the range of the DAC. The voltage $V_{LS}$ across the second capacitor $C_2$ provides a pedestal upon which the DAC range may be superimposed. FIG. 7A depicts four sample situations for the MC-DAC settings covering high, medium, and low range and level shift. And for a fixed MC-DAC structure (e.g., 3-bit binary), the LSB accuracy and the output voltage with the DAC at a given fixed code are variable. FIG. 7B envisages a series of cases with progressively reduced LSB size as the DAC references voltages (e.g., $V_{ref}$ and $V_{cm}$) are adjusted with a target voltage banded by the voltages at the DAC extreme codes.

Although not shown in FIG. 7B, different control systems may be implemented to select settings with increased range and/or alternative level shift settings in response to, for example, load, supply and/or temperature conditions. The flexible nature of the MC-DAC also suggests that fast locking schemes may implement a coarse lock with a high range setting, getting to a higher resolution progressively.

Figure 8:
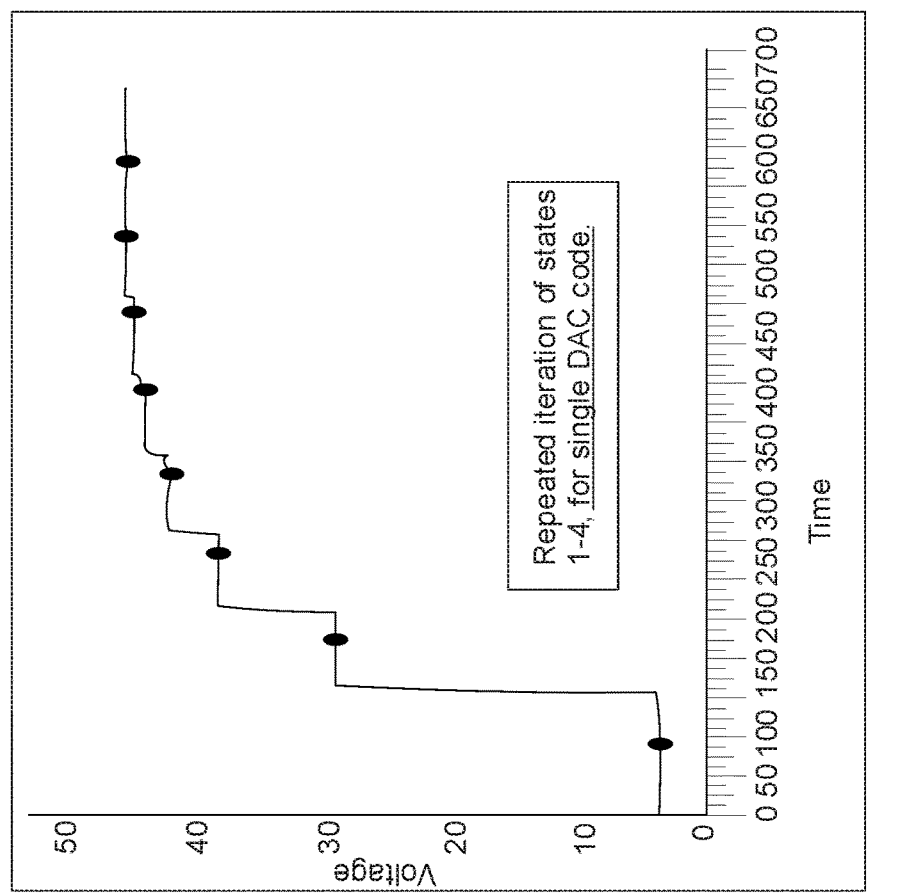
FIG. 8 depicts exemplary simulation results of a gate control voltage generated by the voltage generation circuit.
Figure 8:
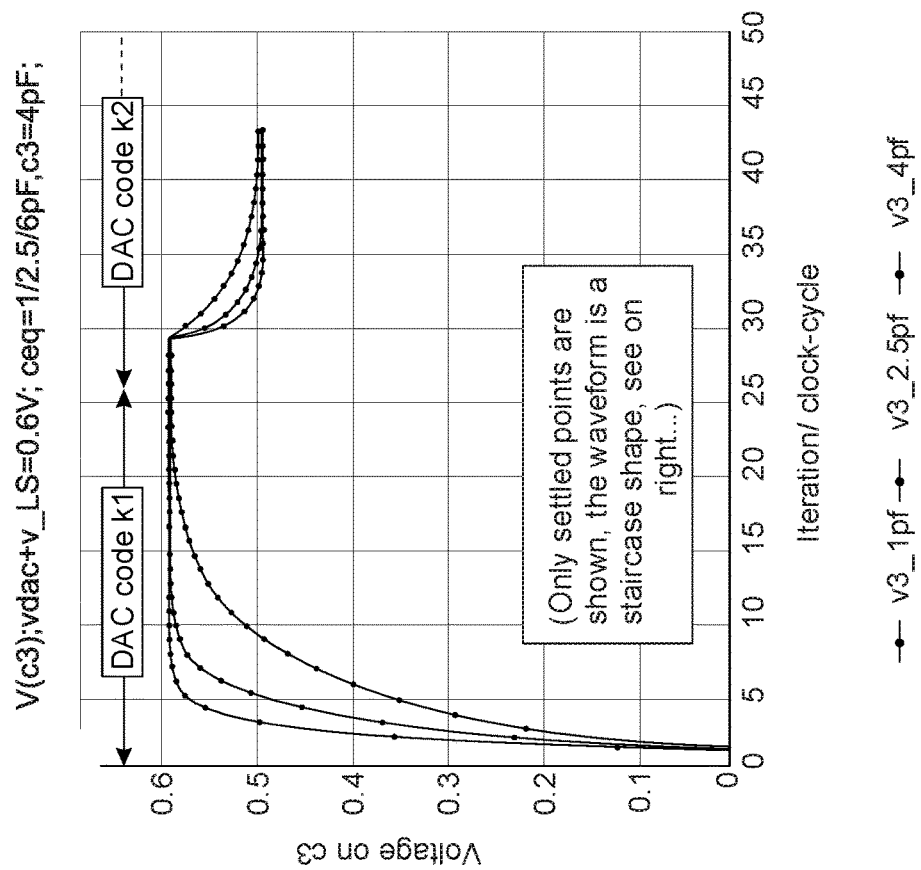

FIG. 8 depicts exemplary simulation results of a gate control voltage generated by the voltage generation circuit. Simulations are performed, with $C_{eq}$ at 1 pF, 2.5 pF and 6 pF, respectively, and C3=4 pF, and a target voltage (e.g., $V_{c3}$) is 0.6V. The re-sampling circuit's output (e.g., $V_{c3}$) is shown. For example, for a DAC code k1, the target voltage (e.g., $V_{c3}$) is achieved within 30 iterations/clock cycles. Then a new DAC code (e.g., DAC code k2) is picked up, and the voltage at the third capacitor $C_3$ may then approach a new voltage.

Figure 9:
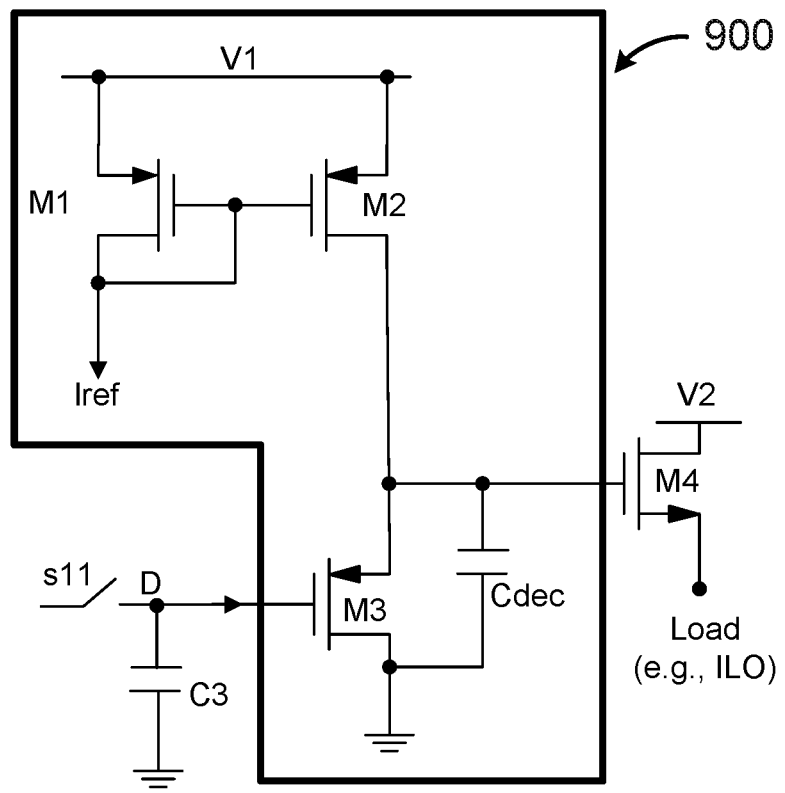
FIG. 9 depicts an exemplary gate drive circuit implemented in the regulation system.

FIG. 9 depicts an exemplary gate drive circuit implemented in the voltage generation circuit. As discussed with reference to FIG. 3, the voltage generation circuit 245 may also include a gate drive circuit coupled to the output of the re-sampling circuit (e.g., the output of the MC-DAC) to further process the voltage $V_{c3}$. In this depicted example, an analog level shifting common-drain amplifier 900 is shown. The amplifier 900 includes three transistors M1-M3 and a decoupling capacitor $C_{dec}$. As shown in FIG. 9, the transistors M1 and M3 provide a reference current $I_{ref}$, and the transistor M3 functions as a PMOS source follower. Other types of circuits may also be used as the gate drive circuit.

Figure 10:
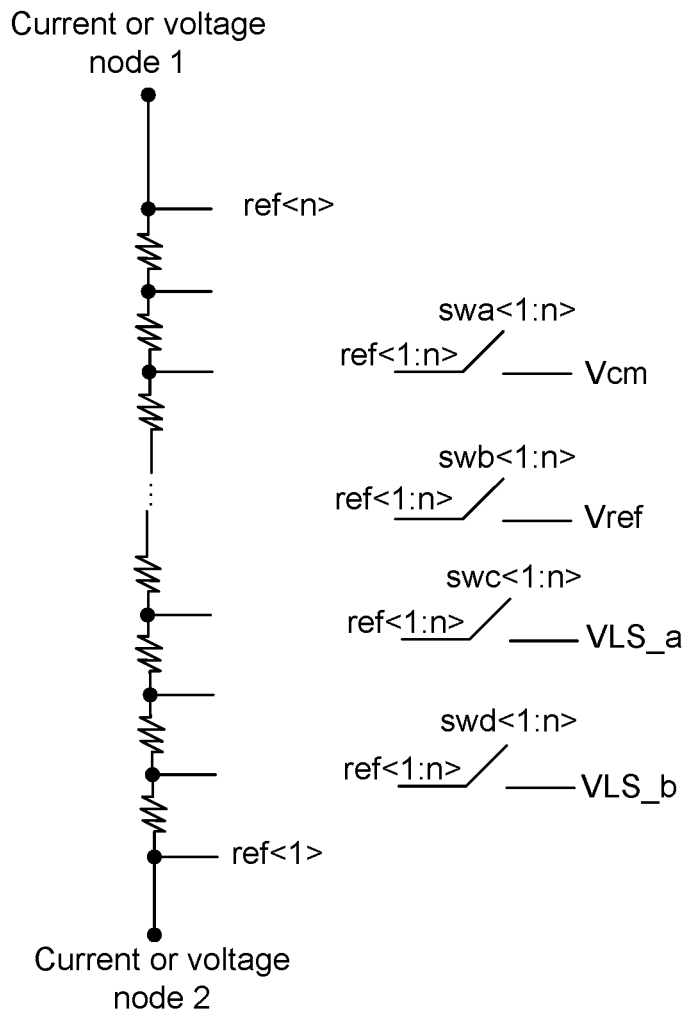
FIG. 10 depicts an exemplary circuit used to generate a set of reference voltages for the MCDAC.

FIG. 10 depicts an exemplary circuit used to generate a set of reference voltages for the MC-DAC. As shown in FIG. 10, a resistor ladder may be used to generate the reference voltages (e.g., $V_{ref}$, $V_{cm}$, $V_{LS\_a}$, $V_{LS\_b}$) used in the MC-DAC. Other implementations may also be used to generate the reference voltages.

In the previous example, the regulation system 225 is arranged on the same integrated circuit (e.g., IC 200) with the clock generation/processing circuit 215. In another embodiment, the regulation system 225 may be implemented in a different integrated circuit (e.g., another integrated circuit) to provide the regulated output voltage $V_{out}$. In the previous example, all parts of the regulation system 225 are arranged on the same integrated circuit (e.g., IC 200). In some embodiments, some or all part of the regulation system 225 may be implemented in various integrated circuits.

In some embodiments, some or all part of the regulation system 225 may be implemented as hard block fixed circuitry. For example, an application specific integrated circuit (ASIC) may provide a regulation system for generating a regulated output voltage with a smaller area. In some embodiments, some or all of the functions of the regulation system 225 may be implemented in a processor that is configured to execute a set of instructions stored in a data store to control the generation of the regulated output voltage. For example, determining whether the voltage at the node D is settled or not may be achieved by a processor. The voltage generation circuit and the data store may be implemented in a programmable logic block of a system-on-chip (SOC) or implemented in a hard block using fixed circuitry of the SOC, and the processor may be implemented in another hard block using, for example, fixed circuitry of the SOC.

Figure 11:
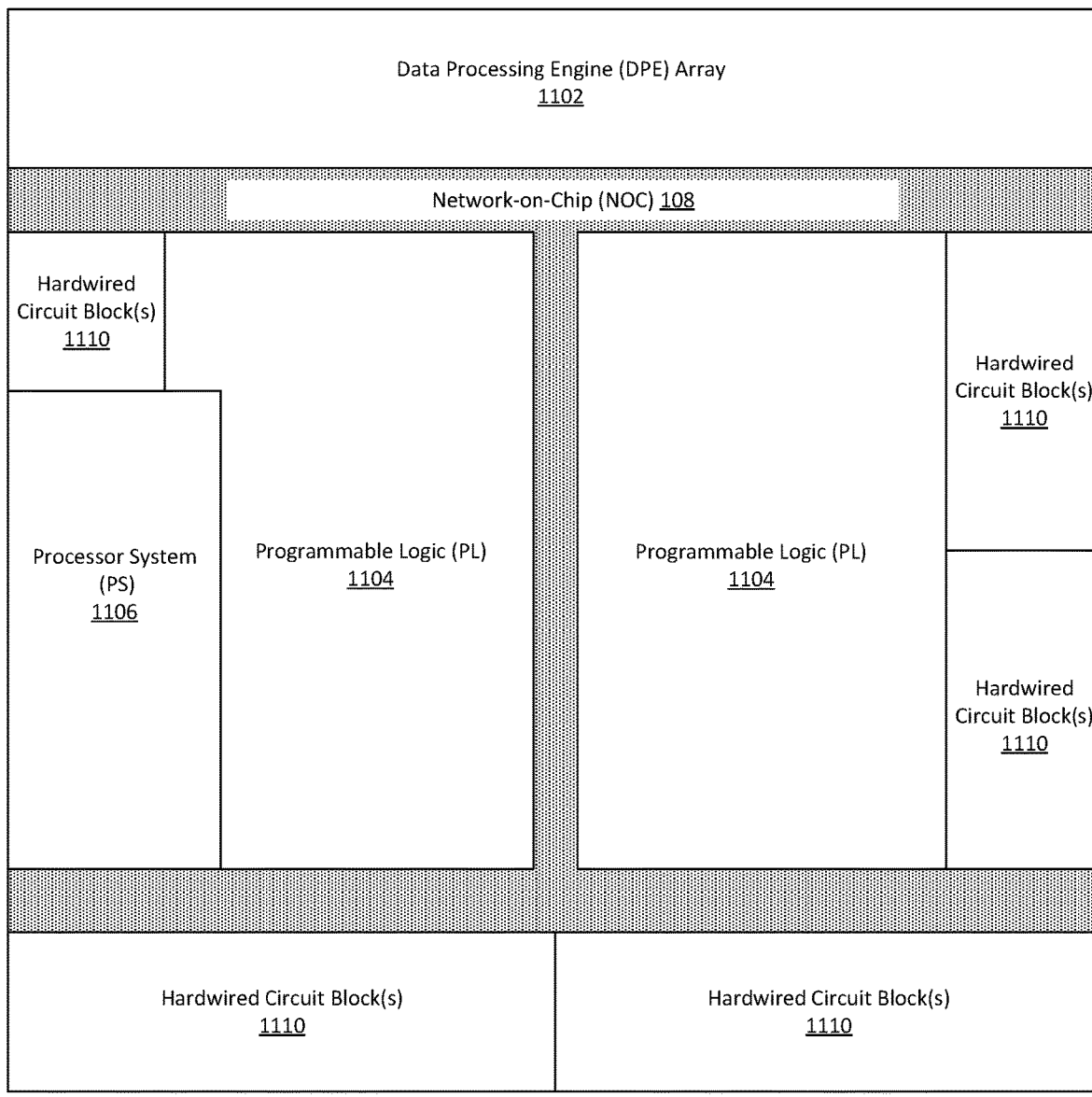
FIG. 11 illustrates an exemplary System-on-Chip (SOC) platform on which the disclosed circuits and processes may be implemented.

FIG. 11 illustrates an exemplary System-on-Chip (SOC) platform on which the disclosed circuits and processes may be implemented. SOC 1100 is an example of a programmable IC and an integrated programmable device platform.

In the example of FIG. 11, the various, different subsystems or regions of the SOC 1100 illustrated may be implemented on a single die provided within a single integrated package. In other examples, the different subsystems may be implemented on a plurality of interconnected dies provided as a single, integrated package. In some embodiments, the SOC 1100 may be an RFSOC. In some embodiments, the SOC 1100 may include ADCs and/or DAC tiles.

In the depicted example, the SOC 1100 includes a plurality of regions having circuitry with different functionalities. In the depicted example, the SOC 1100 optionally includes a data processing engine (DPE) array 1102. The SOC 1100 includes programmable logic (PL) regions 1104 (hereafter PL region(s) or PL), a processing system (PS) 1106, a Network-on-Chip (NOC) 1108, and one or more hardwired circuit blocks 1110. The DPE array 1102 is implemented as a plurality of interconnected, hardwired, and programmable processors having an interface to the other regions of the SOC 1100.

The PL 1104 is circuitry that may be programmed to perform specified functions. As an example, the PL 1104 may be implemented as field programmable gate array type of circuitry. The PL 1104 can include an array of programmable circuit blocks. Examples of programmable circuit blocks within the PL 1104 include, but are not limited to, configurable logic blocks (CLBs), dedicated random access memory blocks (BRAM and/or UltraRAM or URAM), digital signal processing blocks (DSPs), clock managers, and/or delay lock loops (DLLS).

Each programmable circuit block within the PL 1104 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 1106 is implemented as hardwired circuitry that is fabricated as part of the SOC 1100. The PS 1106 may be implemented as, or include, any of a variety of different processor types each capable of executing program code. For example, the PS 1106 may be implemented as an individual processor, e.g., a single core capable of executing program code. In another example, the PS 1106 may be implemented as a multicore processor. In still another example, the PS 1106 may include one or more cores, modules, co-processors, interfaces, and/or other resources. The PS 1106 may be implemented using any of a variety of different types of architectures. Example architectures that may be used to implement the PS 1106 may include, but are not limited to, an ARM processor architecture, an x86 processor architecture, a GPU architecture, a mobile processor architecture, a DSP architecture, or other suitable architecture that is capable of executing computer-readable instructions or program code.

The NOC 1108 includes an interconnecting network for sharing data between endpoint circuits in the SOC 1100. The endpoint circuits can be disposed in the DPE array 1102, the PL regions 1104, the PS 1106, and/or in hardwired circuit blocks 1110. The NOC 1108 can include high-speed data paths with dedicated switching. In an example, the NOC 1108 includes horizontal paths, vertical paths, or both horizontal and vertical paths. The arrangement and number of regions shown in FIG. 11 is merely an example. The NOC 1108 is an example of the common infrastructure that is available within the SOC 1100 to connect selected components and/or subsystems.

The NOC 1108 provides connectivity to the PL 1104, the PS 1106, and to selected ones of the hardwired circuit blocks 1110. The NOC 1108 is programmable. In the case of a programmable NOC used with other programmable circuitry, the nets that are to be routed through the NOC 1108 are unknown until a user circuit design is created for implementation within the SOC 1100. The NOC 1108 may be programmed by loading configuration data into internal configuration registers that define how elements within the NOC 1108 such as switches and interfaces are configured and operate to pass data from switch to switch and among the NOC interfaces.

The NOC 1108 is fabricated as part of the SOC 1100 and while not physically modifiable, may be programmed to establish connectivity between different master circuits and different slave circuits of a user circuit design. The NOC 1108, for example, may include a plurality of programmable switches that are capable of establishing packet switched network connecting user specified master circuits and slave circuits. In this regard, the NOC 1108 is capable of adapting to different circuit designs, where each different circuit design has different combinations of master circuits and slave circuits implemented at different locations in the SOC 1100 that may be coupled by the NOC 1108. The NOC 1108 may be programmed to route data, e.g., application data and/or configuration data, among the master and slave circuits of the user circuit design. For example, the NOC 1108 may be programmed to couple different user-specified circuitry implemented within the PL 1104 with the PS 1106, and/or DPE array 1102, with different hardwired circuit blocks, and/or with different circuits and/or systems external to the SOC 1100.

The hardwired circuit blocks 1110 may include input/output (I/O) blocks, and/or transceivers for sending and receiving signals to circuits and/or systems external to SOC 1100, memory controllers, or the like. Examples of different I/O blocks may include single-ended and pseudo differential I/Os and high-speed differentially clocked transceivers. Further, the hardwired circuit blocks 1110 may be implemented to perform specific functions. Examples of hardwired circuit blocks 1110 include, but are not limited to, cryptographic engines, digital-to-analog converters, analog-to-digital converters, and the like. The hardwired circuit blocks 1110 within the SOC 1100 may be referred to herein from time-to-time as application-specific blocks.

In the example of FIG. 11, the PL 1104 is shown in two separate regions. In another example, the PL 1104 may be implemented as a unified region of programmable circuitry. In still another example, the PL 1104 may be implemented as more than two different regions of programmable circuitry. The particular organization of PL 1104 is not intended as a limitation. In this regard, the SOC 1100 includes one or more PL regions 1104, the PS 1106, and the NOC 1108. The DPE array 1102 may be optionally included.

In other example implementations, the SOC 1100 may include two or more DPE arrays 1102 located in different regions of the IC. In still other examples, the SOC 1100 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLS). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Although various embodiments have been described with reference to the figures, other embodiments are possible. For example, a resistive DAC (RDAC) may be used in place of the MC-DAC. In some embodiments, the capacitive level shifter may be placed before (e.g., precede) the DAC 335. In some embodiments, the MC-DAC may be applied to regulate with reference to supply, as distinct from ground referenced as shown in FIG. 3. Gear-shifting or predictive code jumps may refer to selecting alternative combinations of DAC reference voltage values and the DAC code to minimize deviations in the output voltage $V_{out}$ or to adjust the DAC code range at which the regulation system may reach a steady state (e.g., a periodic steady state).

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit comprising:
   a digital-to-analog converter (DAC) having an input capacitance array and a first capacitor, the first capacitor is coupled between an output node of the DAC and a predetermined voltage node, wherein one or more capacitors in the input capacitance array are selectively coupled to receive a first programmable reference voltage signal and a second programmable reference voltage signal to generate an intermediate voltage signal to charge the first capacitor in response to a number of switch control signals derived from an n-bit digital filter;
   a capacitive level shifter having a first terminal and a second terminal, wherein the first terminal is selectively coupled to a third programmable reference voltage, and the second terminal is selectively coupled to a fourth programmable reference voltage, wherein the second terminal is further selectively coupled to the DAC to receive the intermediate voltage signal; and,
   a re-sampling circuit selectively coupled to the first terminal of the capacitive level shifter to generate a settled voltage signal by refreshing the DAC and the capacitive level shifter.

2. The circuit of claim 1, wherein a value of the settled voltage signal is a function of the first, second, third, and fourth programmable reference voltage signals.

3. The circuit of claim 2, wherein a value of the settled voltage signal is further a function of DAC code and a capacitance value of the input capacitance array in the DAC.

4. The circuit of claim 1, wherein the DAC comprises:
a first plurality of switches and a second plurality of switches;
a plurality of capacitors, wherein one terminal of each capacitor of the plurality of capacitors commonly connected to a first node A, the other terminal of each capacitor of the plurality of capacitors coupled to the first reference voltage through a corresponding switch of the first plurality of switches and coupled to the second reference voltage through a corresponding switch of the second plurality of switches; and,
a first capacitor coupled between the first node A and a low impedance voltage node.

5. The circuit of claim 4, wherein the capacitive level shifter comprises:
a second capacitor having a second node B and a third node C, the second node B is coupled to the fourth programmable reference voltage through a fourth switch, and the third node C is coupled to the third programmable reference voltage through a third switch, wherein the second node B is further coupled to the first node A through a fifth switch.

6. The circuit of claim 5, wherein the re-sampling circuit comprises:
a third capacitor with one end coupled to the third node C through a sixth switch, and the other end of the third capacitor is coupled to a low impedance voltage node.

7. The circuit of claim 1, wherein the DAC comprises a capacitive DAC.

8. The circuit of claim 1, further comprising: a reference voltage generation circuit configured to generate the first, the second, the third, and the fourth programmable reference voltage signals for the DAC and the capacitive level shifter.

9. A system comprising:
a comparator configured to receive a signal and a first predetermined reference value to generate a comparison result;
a digital filter coupled to an output of the comparator to receive the comparison result; and,
an analog voltage generation circuit coupled to an output of the digital filter to generate a first analog signal, wherein the analog voltage generation circuit comprises:
(a) a digital-to-analog converter (DAC) having an input capacitance array and a first capacitor, the first capacitor is coupled between an output node of the DAC and a predetermined voltage node, wherein one or more capacitors in the input capacitance array are selectively coupled to receive a first programmable reference voltage signal and a second programmable reference voltage signal to generate an intermediate voltage signal to charge the first capacitor in response to a number of switch control signals derived from the digital filter;
(b) a capacitive level shifter having a first terminal and a second terminal, wherein the first terminal is selectively coupled to a third programmable reference voltage, and the second terminal is selectively coupled to a fourth programmable reference voltage, wherein the second terminal is further selectively coupled to the DAC to receive the intermediate voltage signal; and,
(c) a re-sampling circuit selectively coupled to the first terminal of the capacitive level shifter to generate a settled voltage signal by refreshing the DAC and the capacitive level shifter.

10. The system of claim 9, wherein the settled voltage signal is a function of the first, the second, the third, and the fourth programmable reference voltage signals.

11. The system of claim 10, wherein the settled voltage signal is further a function of DAC code and a capacitance value of the input capacitance array in the DAC.

12. The system of claim 9, further comprising: a voltage drive circuit coupled to the analog voltage generation circuit to receive the first analog signal.

13. The system of claim 9, wherein the DAC comprises:
a first plurality of switches and a second plurality of switches;
a plurality of capacitors, wherein one terminal of each capacitor of the plurality of capacitors commonly connected to a first node A, the other terminal of each capacitor of the plurality of capacitors coupled to the first programmable reference voltage signal through a corresponding switch of the first plurality of switches and coupled to the second programmable reference voltage signal through a corresponding switch of the second plurality of switches; and,
a first capacitor coupled between the first node A and a low impedance voltage node.

14. The system of claim 13, wherein the capacitive level shifter comprises:
a second capacitor having a second node B and a third node C, the second node B is coupled to the fourth programmable reference voltage signal through a fourth switch, and the third node C is coupled to the third programmable reference voltage signal through a third switch, wherein the second node B is further coupled to the first node A through a fifth switch.

15. The system of claim 13, wherein the re-sampling circuit comprises:
a third capacitor with one end coupled to the third node C through a sixth switch, and the other end of the third capacitor is coupled to a low impedance voltage node.

16. A method comprising:
providing a digital-to-analog converter (DAC) having an input capacitance array and a first capacitor;
coupling the first capacitor between an output node of the DAC and a low impedance voltage node;
coupling the input capacitance array to selectively receive a first programmable reference voltage signal and a second programmable reference voltage signal via a number of switches and generate an intermediate voltage signal at the output node;
providing a capacitive level shifter having a first terminal and a second terminal;
controllably coupling the first terminal to a third programmable reference voltage signal and coupling the second terminal to a fourth programmable reference voltage signal;
controllably coupling the second terminal to the output node of the DAC to receive the intermediate voltage signal at the output node of the DAC; and,
providing a re-sampling circuit and coupling one terminal of the re-sampling circuit to the first terminal of the capacitive level shifter to generate a gate control signal.

17. The method of claim 16, wherein a value of the gate control signal is a function of the first, the second, the third, and the fourth predetermined reference voltage signals.

18. The system of claim 17, wherein a value of the gate control signal is further a function of a capacitance value of the input capacitance array in the DAC.

19. The method of claim 16, wherein providing the capacitive level shifter comprises:

providing a second capacitor having a second node B and a third node C;

coupling the second node B to the fourth programmable reference voltage signal through a fourth switch and coupling the second node B to the output node through a fifth switch; and, coupling the third node C to the third programmable reference voltage signal through a third switch.

20. The method of claim 19, wherein the re-sampling circuit comprises:

a sixth switch coupled between the third node C and a fourth node D; and, a third capacitor coupled between the fourth node D and a predetermined low impedance voltage node, wherein the gate control signal comprises a voltage signal at the fourth node D.

\* \* \* \* \*